US006884638B1

(12) United States Patent
Yang et al.

(10) Patent No.: US 6,884,638 B1
(45) Date of Patent: Apr. 26, 2005

(54) METHOD OF FABRICATING A FLASH MEMORY SEMICONDUCTOR DEVICE BY DETERMINING THE ACTIVE REGION WIDTH BETWEEN SHALLOW TRENCH ISOLATION STRUCTURES USING AN OVERDRIVE CURRENT MEASUREMENT TECHNIQUE AND A DEVICE THEREBY FABRICATED

(75) Inventors: Tien-Chun Yang, San Jose, CA (US); Nian Yang, San Jose, CA (US); Zhigang Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 87 days.

(21) Appl. No.: 10/225,052

(22) Filed: Aug. 20, 2002

(51) Int. Cl.[7] .............................................. H01L 21/66
(52) U.S. Cl. ......................................... 438/14; 438/15
(58) Field of Search ................ 438/14, 15; 365/185.03; 257/314

(56) References Cited

U.S. PATENT DOCUMENTS

| | | | | |
|---|---|---|---|---|
| 5,420,822 A | * | 5/1995 | Kato et al. ................... 365/218 |
| 5,467,306 A | * | 11/1995 | Kaya et al. ............... 365/185.2 |
| 5,541,505 A | * | 7/1996 | Azumai .................... 324/158.1 |
| 5,576,994 A | * | 11/1996 | Kato et al. ............. 365/185.23 |
| 5,592,418 A | * | 1/1997 | Sabatini et al. ........ 365/185.03 |
| 5,596,528 A | * | 1/1997 | Kaya et al. ............ 365/185.24 |
| 5,625,591 A | * | 4/1997 | Kato et al. ............. 365/185.22 |
| 5,732,022 A | * | 3/1998 | Kato et al. ............. 365/185.24 |
| 6,114,209 A | * | 9/2000 | Chu et al. .................... 438/300 |
| 6,128,219 A | * | 10/2000 | Pio et al. ................ 365/185.09 |
| 6,134,140 A | * | 10/2000 | Tanaka et al. ......... 365/185.03 |
| 6,208,560 B1 | * | 3/2001 | Tanaka et al. ......... 365/185.22 |
| 6,245,639 B1 | * | 6/2001 | Tsai et al. ................... 438/424 |
| 6,434,055 B1 | * | 8/2002 | Tanaka et al. ........... 365/185.3 |
| 6,530,068 B1 | * | 3/2003 | Cao et al. ....................... 716/8 |
| 6,549,464 B1 | * | 4/2003 | Tanaka et al. ......... 365/185.22 |
| 6,617,251 B1 | * | 9/2003 | Kamath et al. ............. 438/691 |
| 6,765,827 B1 | * | 7/2004 | Li et al. ................. 365/185.09 |
| 2002/0022326 A1 | * | 2/2002 | Kunikiyo .................... 438/296 |

* cited by examiner

Primary Examiner—John F. Niebling
Assistant Examiner—Olivia Luk
(74) Attorney, Agent, or Firm—Farjami & Farjami LLP

(57) ABSTRACT

A method for fabricating a flash memory device by determining the active region width (10) of a semiconductor device (27) using a measuring technique for the source drain overdrive current elements (31, 32, 33) having different active region widths and using that difference to establish the difference between the active region width of the devices (31, 32, 33) and the drawn width and using the difference to establish the actual width (10) from drawn width in future devices, and a device thereby fabricated.

17 Claims, 2 Drawing Sheets

METHOD OF FABRICATING A FLASH MEMORY SEMICONDUCTOR DEVICE BY DETERMINING THE ACTIVE REGION WIDTH BETWEEN SHALLOW TRENCH ISOLATION STRUCTURES USING AN OVERDRIVE CURRENT MEASUREMENT TECHNIQUE AND A DEVICE THEREBY FABRICATED

CROSS-REFERENCE TO RELATED APPLICATION(S)

This application is also related to the following commonly assigned applications (serial numbers to be assigned) entitled:
(1) "Method of Fabricating a Flash Memory Semiconductor Device by Determining the Active Region Width between Shallow Trench Isolation Structures Using a Noninvasive Nondestructive Testing Technique and a Device thereby Fabricated,"Ser. No. 60/414,130;
(2) "Method of Fabricating a Flash Memory Semiconductor Device by Determining the Source/Drain Tunneling Width between Shallow Trench Isolation Structures Using a Noninvasive Nondestructive Testing Technique and a Device thereby Fabricated"; Ser. No. 10/224,757; and
(3) "Method of Fabricating a Flash Memory Semiconductor Device by Determining the Active Region Width between Shallow Trench Isolation Structures Using a C-V Measurement Technique and a Device thereby Fabricated, "Ser. No. 10/224,028.

TECHNICAL FIELD

The present invention relates to the fabrication of semiconductor devices. In particular, the present invention relates to the production of flash memory semiconductor devices. With still greater particularity, the present invention relates to testing procedures used to determine active region width between shallow trenches used to isolate circuit elements in flash memory arrays.

BACKGROUND ART

Flash memory semiconductor devices are used in wide array of electronic apparati, such as computers, digital cameras, and personal digital assistants. In all of such applications, increasing memory capacity and reducing electrical consumption are desirable. The primary approach to increasing capacity and decreasing power requirements has been making smaller each succeeding generation of devices. The current technology is less than 0.25-$\mu$m in geometry. As the circuit elements become smaller, problems have arisen relating to the interference between different circuit elements.

The former generation of flash memory semiconductor devices used local oxidation of silicon (LOCOS) technology to isolate circuit elements. LOCOS has been replaced in the current generation by shallow trench isolation (STI) technology to isolate circuit elements. In STI technology, shallow trenches are formed between circuit elements, such as metal oxide semiconductor field effect transistors (MOSFETs). MOSFETs include a source and a drain region of doped semiconductor material between which current traverses. This current is controlled by a gate which is insulated from the source and drain regions by a thin layer of insulating material. If, as is conventional, multiple gate layers insulated from each other by insulating layers exist, a "floating" gate is produced which gains its signal through the principle of quantum tunneling. In STI technology, the source, drain, and floating gate are formed between the shallow trenches etched into the substrate of semiconductor materials, such as silicon, germanium, or gallium arsenide. A thin layer of an insulating material such as silicon oxide (SiO) is formed over the area between the trenches to insulate the active region. The gate, often a layer of polycrystalline silicon, is formed over this insulating layer. In operation a small charge on this gate can control a larger flow between the source and the drain. The active region width is approximately the distance between the source and drain areas that is under the gate area.

A problem has arisen in STI technology where thinning portions of an insulating layer or tunnel oxide layer adjacent relatively thinning corners of the STI structures has developed. These thinning portions are difficult to measure and quantify. The presence of thinning portions may be made by monitoring the Fowler-Nordheim (F-N) tunneling current. However, such a measurement gives no measure of nor provides any information about the total physical overlap area between the floating gate and the active region.

This overlap has a large impact on the programming current distribution and core gain. As a result, an outstanding need is seen to exist for a method of fabricating a flash memory semiconductor device by determining the active region width accurately and a STI flash memory semiconductor device thereby fabricated.

DISCLOSURE OF THE INVENTION

The present invention a method of fabricating a flash memory semiconductor device by determining the active region width accurately by using an overdrive current measurement technique and a STI flash memory semiconductor device thereby fabricated. The present device comprises at least one composite field effect transistor structure having a plurality of transistor elements. The present method measures the overdrive current of each composite field effect transistor, where each at least one transistor has an identical region length (i.e., equal source/drain lengths) but also has a distinct active region width and a distinct predetermined width. The respective overdrive current value of each at least one composite transistor structure facilitates determining the active region widths for various MOS transistor elements by using the noninvasive nondestructive testing techniques. Since the respective measured overdrive current values correspond to the various active regions where tunnel oxide thinning occurs, the corresponding active region widths can be determined. The present method allows the active region width to be measured by noninvasive nondestructive testing. The present method is useful for mass production allowing monitoring of the processing involved in flash memory semiconductor device fabrication.

The present method measures the current flowing across the area of an intermediate "floating gate," equivalent to a "capacitor" element, overlapping the active region. This current, specifically an overdrive current, underneath the floating gate across the "overlap area" from drain to source is measured at an applied voltage in excess of the gate threshold voltage. By measuring the overdrive current, the present invention avoids the measurement inaccuracies in the related by eliminating error due to current fluctuation which can adversely affect current flows at lower gate voltages. In the present invention, the overdrive current comprises is a quasi-linear function which exhibits de minims sensitivity to any variations (e.g., thinning or thickening portions) in tunnel oxide layer thickness adjacent the possibly thinning or thickening STI structure upper corners.

This is due to the small area thinning portions of the tunnel oxide layer relative to the entire gate structure area. The active region width can be mathematically derived from empirical measurements of the overdrive current under an applied "overdriven" gate voltage (i.e., in excess of the gate threshold voltage).

The present method provides crucial information to the flash memory technology, because active channel width, corresponding to active region widths, affects the following parameters: the programming current, the programmed voltage threshold, the threshold voltage distribution, as well as the core gain. The summation of these parameters has a large impact on the construction of flash memory semiconductor devices and the technology therewith associated.

BRIEF DESCRIPTION OF THE DRAWINGS

For a better understanding of the present invention, reference is made to the below-referenced accompanying drawing(s) which is/are for illustrative purposes and where like reference numbers denote like elements.

Figure 1:
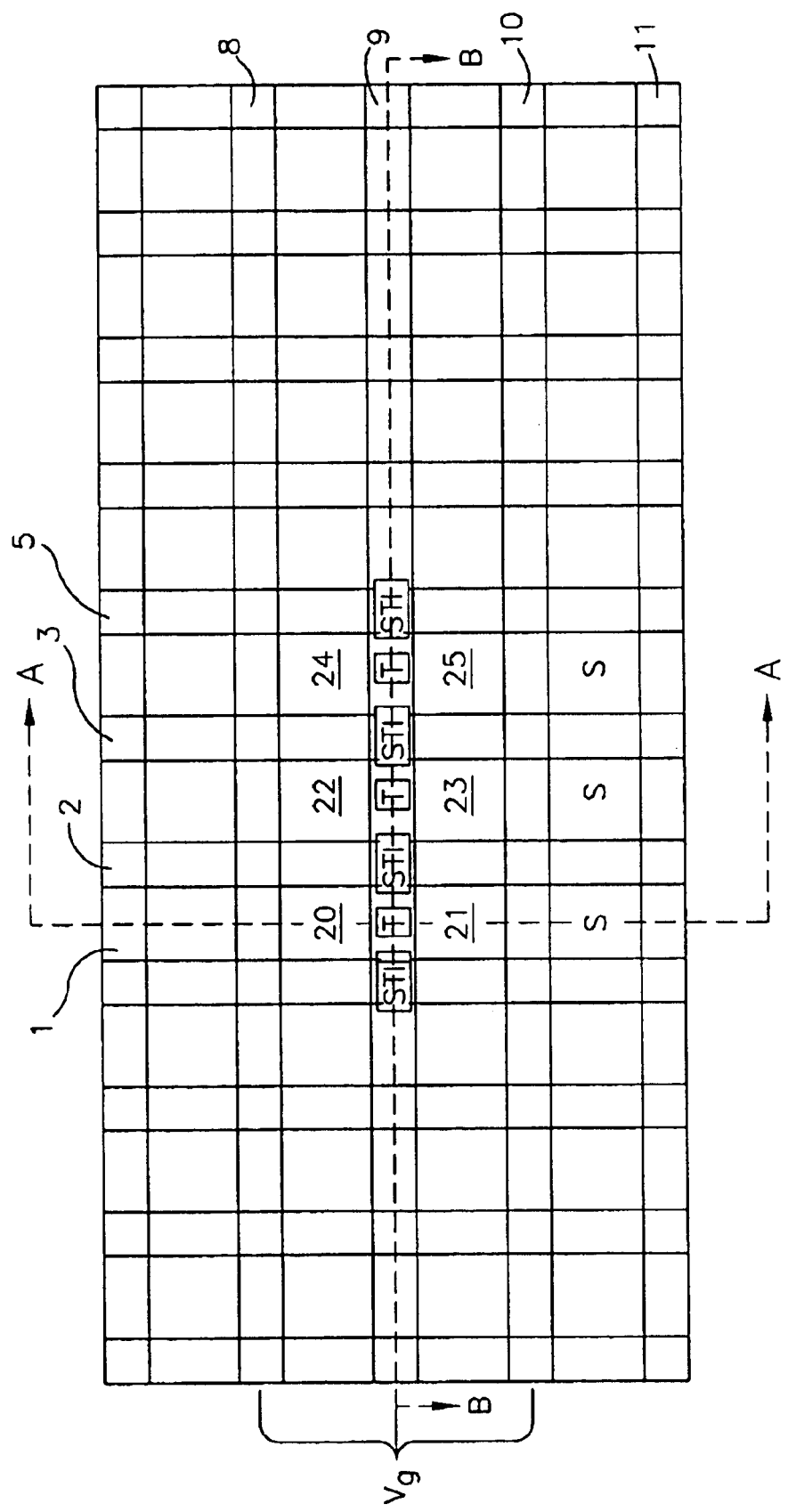
FIG. 1 is a top plan view of a device in accordance with the present invention.
Figure 2:
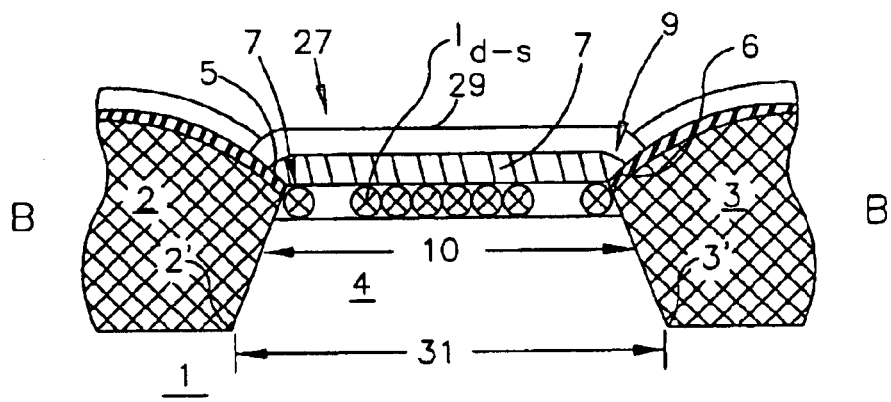

(2) FIG. 2 front elevation cross-sectional view along line B—B of FIG. 1 of a transistor element, in accordance with the present invention.

Figure 3:
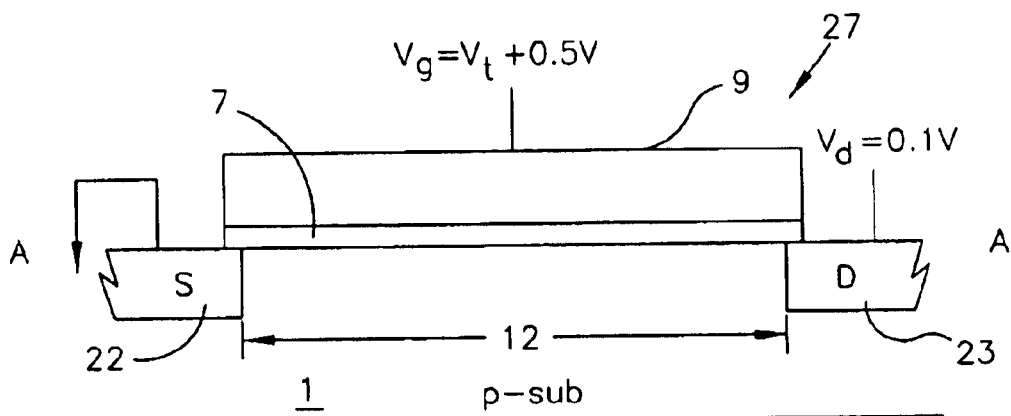

(3) FIG. 3 is a front elevation cross-sectional view along line A—A of FIG. 1 of a transistor element showing a floating gate, source/drain regions, in accordance with the present invention.

Figure 4:
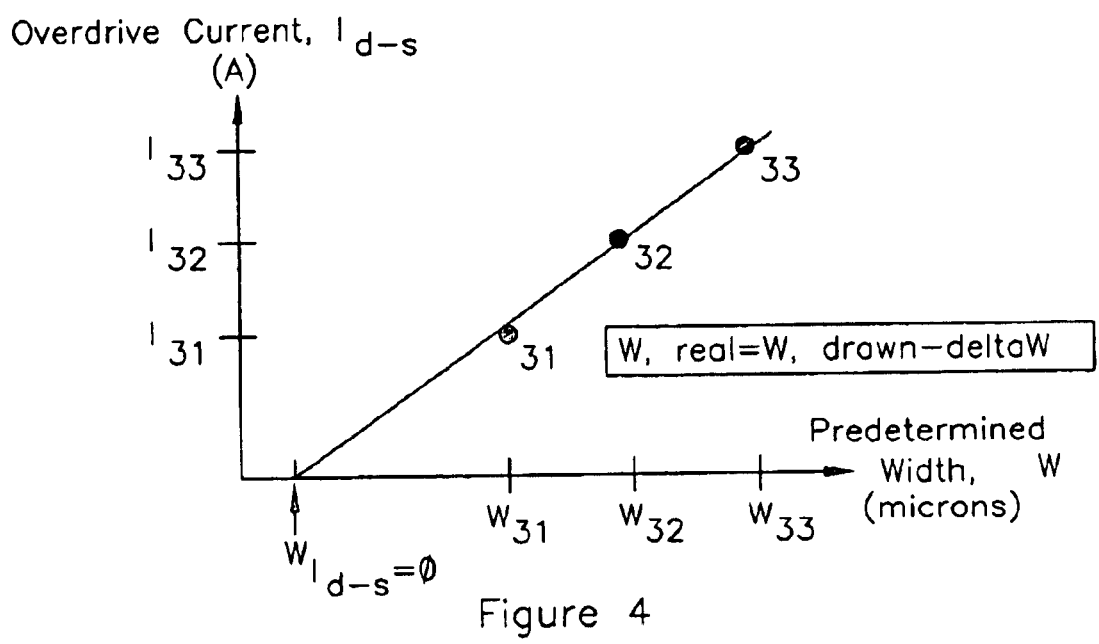

(4) FIG. 4 is a graphical representation of the overdrive current as a function of the predetermined width, in accordance with the present invention.

BEST MODE FOR CARRYING OUT THE INVENTION

FIG. 1 is a top plan view of a device in accordance with the present invention. The substrate 1 comprises at least one semiconducting material selected from a group consisting essentially of silicon, germanium, and a binary material such as gallium arsenide. In silicon on insulator (SOI) technology, an insulating material layer, such as silicon oxide (SiO) and silicon dioxide ($SiO_2$), is formed on substrate 1. Semiconductor substrate 1 is divided into a plurality of roughly rectangular semiconductor elements by a series of shallow trenches 2,3 and 5 which run vertically in the drawing. In the horizontal direction a series of lines of polysilicon 8–11 simulate gate elements on a transistor. A layer of insulating material not visible in this figure insulates lines 9–11 from elements below. The surface is lightly doped to produce areas that simulate sources 20,22 and 24 and drains 21,23 and 25. Lines 9–11 act as a mask to facilitate this doping process. Electrical connections (not shown) are made to each line of sources 20,22 and 24 and drains 21,23 and 25. A device made in the described manner will have a magnified because the many small transistors formed and wired in parallel have a greater proportion of their area occupied by edges than conventional transistors.

FIG. 2 front elevation cross-sectional view along line B—B of FIG. 1 of a single transistor element 27 in accordance with the present invention. At least one such transistor element 27 is created on a semiconductor substrate 1. A plurality of shallow trench isolation structures (STI) 2 and 3 are formed in the substrate 1 to separate circuit elements. In current flash memory semiconductor devices, thousands or millions of identical elements, such as transistors or capacitors, are formed on a single chip. Here, a single transistor element 27 of the FIG. 1 device is shown for clarity. In the final device, shallow trenches 2' and 3' are filled with an insulating material, thereby forming STI structures 2 and 3. The active region 4 of the substrate 1 is disposed between STI structures 2 and 3, wherein a transistor is ultimately formed in active region 4. A thin insulating material layer 7, such as SiO and $SiO_2$, is formed on active region 4 to form a tunnel oxide layer 7 (from the thin insulating material layer 7) for insulating active region 4 from other conductive elements. Semiconducting material layer such as polycrystalline silicon, is patterned to form a floating gate portion 29 of polysilicon line 9 over the insulating material layer 7 of a field effect transistor. A first zone 5 of the tunnel oxide layer 7, adjacent to the STI structure 2 of the active region 4, and a second zone 6 of the tunnel oxide layer 7, adjacent to the STI structure 3 and active region 4, define the corner portions of the tunnel oxide layer 7. Corner portions 5 and 6 may be thickened or thinned dependant upon an unpredictable yet consistent aspect of the manufacturing process used to produce the device. Critical factors in determining the characteristics of a transistor formed by the present technique include the active region width 10 defined by the distance between STI structures 2 and 3 which is overlain by floating gate 9 and the direction and quantity of corner thinning or thinning in regions 5 and 6. An electrical current $I_{d-s}$ flows during transistor operation in a direction normal to active width 10. Active region width 10 will vary if there is thickening or thinning in corner regions 5 and 6. The "real" or "effective" active region width 10 is neither known nor feasibly measurable. The predetermined width, also known as "drawn" width 31 is the physical distance between the STI structures 2 and 3. To practice the invention multiple devices are created on the chip having different drawn widths which will produce different active widths 10. For the purposes of this application three such widths 31, 32 (not shown) and 33 (not shown) will be described although the invention only requires 2 or more.

FIG. 3 is a front elevation cross-sectional view along line A—A of FIG. 1 of a transistor element 27, in accordance with the present invention. Transistor element 27 is provided with a source region 22 and a drain region 23. Source region 22 and drain region 23 may be suitably implanted with a dopant, such as boron (B), phosphorous (P), and arsenic (As) by using polysilicon line 9 as a mask. In normal transistor operation, an electrical current flows from the drain region 23 to the source region 22. If an electrical charge is applied to the floating gate 9, such charge controls the amount of current flowing between source 22 and drain 23. In testing, source region 22 is electrically connected to "ground" while the drain region 23 has an overdrive voltage (e.g., 0.1 V) applied. Under such conditions, an overdrive current ($I_{d-s}$) will flow between from the drain region 23 to the source region 22 of in the active region 4 in a distance equal to the source/drain active region width 12 of transistor element 27. Floating gate 9 is insulated from the active region 12 between the source region 22 and the drain region 23 by the tunnel oxide layer 7. Transistor element 27 has a characteristic called the floating gate threshold voltage ($V_t$) which is the applied voltage to the floating gate 9 allowing a current to flow between the source region 22 and the drain region 23. In this embodiment, a voltage equal to the floating gate threshold voltage ($V_t$) plus approximately one-half volt (~0.5 V) is applied to the floating gate 9, which is a higher voltage than expected in normal operation of such devices. The current flowing between source region 22 and the drain region 23 under such conditions is also known as an overdrive current. In the present invention, the overdrive current ($I_{d-s}$) under such conditions, is proportional to the active region width 12 of the transistor element 27.

To practice the invention of FIG. 1, a plurality of transistors as described above are fabricated with the only difference being their respective active region widths 31, 32 and 33. The length of all other transistor elements are the same so distance 12 illustrated in FIG. 3 does not vary. Reiterating, the active region width 10 cannot be feasibly directly measured for a number of reasons. Firstly, the active region 10 is overlaid by the gate electrode 9 and the tunnel oxide layer 7. Secondly, the source region 22 and the drain region 23 changed by tunnel oxide thickening or thinning are not readily discernible by typical related art characterization techniques, as these regions contain only de minims impurities (i.e., dopants). As such, the actual active region width 10 and by inference distance 12 in FIG. 3 are indirectly determined in the present method by (1) measuring the electrical characteristics (i.e., overdrive current) of the various capacitor elements in the device which may be altered in unpredictable but consistent ways by the manufacturing process and (2) deriving the active region width from known data and empirical data taken in step (1).

A voltage, in excess of the gate threshold voltage, is applied across the overlap area under the floating gate electrode 9 to measure the overdrive current for each respective transistor element 27 with the different respective predetermined widths 31, 32, 33. The active region width 10 is defined as the actual width of the area in which current flows from source 22 to drain 23. The active region width 10 is optically unperceivable, but may be accurately characterized using the present electrical measurement technique. In FIG. 2, for example, the width 10 of the active region is equal to the distance between the heads of the double arrows. The active region width 10 (i.e., as defined at the upper portion of the active region 4) is different from the predetermined width 31, 32, 33 (i.e., as defined at the lower portion of the active region 4) which is the distance between the lower portions of the STI structure 2 and the STI structure 3, as measured on the drawing (i.e., the active region may actually be quasi-trapezoidal in cross-section, rather than rectangular). This misshapen geometric circumstance arises from a combination of factors, such as floating gate patterning and shallow trench isolation corner formation, which contributes to either thinning or thickening of the opposing portions of the tunnel oxide layer 7 adjacent the upper corners of the STI structures 2 and 3. The high floating gate voltage acts further to limit current fluctuations which adversely affect the overdrive current ($I_{d-s}$) flowing between from the drain region 23 to the source region 22 at low gate voltages. The current flowing between the gate 24 and source region 22, under such conditions, is not very sensitive (i.e., not exponential) to variations in tunnel oxide layer thickness, as the thinning or thickening portions of the tunnel oxide layer occupy only a small part of the whole structure. The overdrive current ($I_{d-s}$) varies quasi-linearly with the predetermined widths 31, 32, and 33.

Referring now to FIG. 4, a plot is shown of the various capacitance values $I_{31}$, $I_{32}$, $I_{33}$ for the respective transistor elements of different predetermined length 31, 32, 33, as a function of the respective predetermined widths 31, 32, 33. These overdrive current values $I_{31}$, $I_{32}$, $I_{33}$ facilitate developing a $I_W$ curve for use in determining the active region width 10, 10' and 10" respectively of a MOS transistor of a flash memory device. Initially, in a fabrication process, all that is known about each transistor is that it has a predetermined width W which are respectively indicated as 31, 32, 33. The overdrive current is next measured, using the above technique, for each of the transistor elements and respectively recorded as $I_{31}$, $I_{32}$, $I_{33}$. The overdrive current for each transistor element may then be represented on the y-axis (ordinate) of the graph (e.g., in microamps); and each respective predetermined width $W_{31}$, $W_{32}$, $W_{33}$ may be represented on the x-axis (abscissa) of the graph (e.g., in microns). The points along the curve $I_W$, so determined in the present invention, substantially form a "line" which then may be designated as $I_W$ (i.e., a quasi-linear representation). In the present invention, particularly in the calibration procedure, this line is extrapolated to intersect the x-axis at zero current, wherein such point on the abscissa indicates the theoretical difference $\Delta W$ (i.e., a calibration term) between each respective predetermined width W (i.e., 31, 32, 33) and active region widths 10, 10' and 10" respectively of the active region 4 between zones 5 and 6 of the tunnel oxide layer 7 and between the respective STI structures 2, 3. Noteworthy, is that, due to nonlinearities, direct measurement of $\Delta W$ is not empirically possible at zero current; however, the present method, using a linear approximation and extrapolation (calibration procedure) in conjunction with using a overdrive current technique, provides a superior means for better determining each respective active region widths 10, 10' and 10". Once $\Delta W$ is known (extrapolated.) for a particular semiconductor fabrication process, as plotted in FIG. 4, the active region width 10 is determined by subtracting $\Delta W$ from the various predetermined widths W (e.g., 31, 32, 33) (i.e., active region widths 10, 10' and 10"=W−$\Delta W$), thereby improving programming current, programmed voltage threshold, threshold voltage distribution, and core gain in a flash memory semiconductor device.

INDUSTRIAL APPLICABILITY

The present invention applies to the semiconductor fabrication industry. In particular, the present invention relates to the flash memory device fabrication industry. With still greater particularity, the present invention applies to testing procedures, used in the semiconductor device fabrication industry, for determining the active region width disposed between shallow trench isolation structures which insulate circuit elements in flash memory arrays.

SCOPE OF THE INVENTION

Information as herein shown and described in detail is fully capable of providing the solutions of the present invention; and the presently preferred embodiment is, thus, representative of the subject matter which is broadly contemplated by the present invention. The scope of the present invention fully encompasses other embodiments, which may become obvious to those skilled in the art, and is to be limited accordingly by nothing other than the appended claims, wherein reference to an element in the singular is not intended to mean "one and only one," unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public, regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. §112, sixth paragraph, unless the element is expressly recited using the phrase "means for."

What is claimed:

1. A process for determining the active width of a semiconductor device having a source, drain, and gate comprising the steps of,
    measuring the source drain overdrive current of a given device, and
    comparing said source drain overdrive current to known source drain overdrive currents correlated to known active widths to determine said active width.

2. The process for determining the active width of a semiconductor device having a source, drain, and gate of claim 1, wherein said measuring step is performed by biasing said gate of said device in excess of the threshold voltage of said device.

3. The process for determining the active width of a semiconductor device having a source, drain, and gate of claim 2, wherein said measuring step is performed by biasing said gate of said device by or about one half volt in excess of the threshold voltage of said device.

4. The process for determining the active width of a semiconductor device having a source, drain, and gate of claim 1, further comprising the steps of;
    fabricating a plurality of test semiconductor devices having a source, drain, and gate having drawn active widths which differ by a known distance, and
    measuring the source drain overdrive current of each test device, and
    comparing the difference in source drain overdrive current of each test device to the known difference in active width of each test device to establish a width value appropriate to a source drain current of zero, and
    subtracting said established width value appropriate to a source drain current of zero from said drawn active width to establish a real active width.

5. The process for determining the active width of a semiconductor device having a source, drain, and gate of claim 4, wherein there are at least three of such test devices.

6. The process for determining the active width of a semiconductor device having a source, drain, and gate of claim 4, wherein said comparing step is performed by graphing the measured source drain overdrive current on one axis and the corresponding drawn width of each device on another axis to form a set of points, and
    extending a line through said points to find the value of the point where the extended line intersects the axis corresponding to zero source drain current, and
    taking the value of drawn width at said intersection point, and
    subtracting said taken value from said drawn value to find the real value of the active width.

7. The process for determining the active width of a semiconductor device having a source, drain, and gate of claim 6, wherein at least three of such test devices are used.

8. The process for determining the active width of a semiconductor device having a source, drain, and gate of claim 1, wherein said device is defined by a plurality of shallow trenches for isolating said device from neighboring devices.

9. The process for determining the active width of a semiconductor device having a source, drain, and gate of claim 8, wherein said device is a flash device.

10. The process for determining the active width of a semiconductor device having a source, drain, and gate of claim 8, wherein said the distance between the tops of said shallow trenches is defined as the drawn width of said device.

11. A method of determining an active region width for fabricating a flash memory semiconductor device, comprising the steps of:
    (a) forming at least one composite transistor structure, said at least one composite transistor structure comprising:
        a semiconductor substrate having a plurality of shallow trench isolation (STI) structures formed therein and a plurality of active regions disposed between successive STI structures;
        an insulating layer formed on said substrate; and
        a semiconducting layer formed on said insulating layer, at least one transistor element being formed between said successive STI structures at each said active region, each said active region having a predetermined width and an active region width, said predetermined width and said active region width both being distinct for each said at least one composite transistor structure, and each said at least one composite transistor structure having a respective distinct overdrive current value that facilitates determining said active region width; and
    (b) determining said respective active region width by:
        measuring said respective overdrive current values;
        calculating a respective effective composite transistor structure area from the overdrive current value;
        calculating said respective active region width from said calculated respective effective composite transistor structure area and a known STI structure length;
        subtracting said respective active region width from said respective predetermined width, thereby providing a respective width difference.

12. The method, as recited in claim 11, wherein said step (a) comprises: forming each said STI structure having opposing upper corner regions; forming said insulating layer comprising a tunnel oxide layer being disposed between said opposing corner regions and having a mid-portion and opposing end portions; and respectively disposing said opposing end portions adjacent said opposing upper corner regions.

13. The method, as recited in claim 11, wherein said step (a) comprises forming said insulating layer comprising at least one material selected from a group consisting essentially of silicon oxide (SiO) and silicon dioxide ($SiO_2$).

14. The method, as recited in claim 11, wherein said step (a) comprises forming said semiconducting layer comprising polysilicon (poly-Si).

15. The method, as recited in claim 11, wherein said step (b) comprises said width difference being a high value and indicating a narrow effective source/drain channel width.

16. The method, as recited in claim 11, wherein said step (b) comprises said width difference being a low value and indicating a broader effective source/drain channel width.

17. The method, as recited in claim 12, wherein said step (a) comprises forming said opposing end portions substantially thinner than said mid-portion.

* * * * *